United States Patent [19]

Suyama et al.

[11] Patent Number: 4,835,783

[45] Date of Patent: May 30, 1989

[54] SEMICONDUCTOR LASER

[75] Inventors: Takahiro Suyama, Tenri; Toshiro Hayakawa, Nara; Kohsei Takahashi; Masafumi Kondo, both of Tenri; Saburo Yamamoto, Nara, all of Japan

[73] Assignee: Sharp Kabushiki Kaisha, Osaka, Japan

[21] Appl. No.: 41,483

[22] Filed: Apr. 23, 1987

[30] Foreign Application Priority Data

Apr. 30, 1986 [JP] Japan .............................. 61-102982

[51] Int. Cl.⁴ .............................................. H01S 3/19
[52] U.S. Cl. ........................................ 372/46; 372/45
[58] Field of Search ...................... 372/46, 45, 44, 43; 357/17

[56] References Cited

U.S. PATENT DOCUMENTS 4,445,218  4/1984  Coldren ................................ 372/44

FOREIGN PATENT DOCUMENTS 0156566  3/1985  European Pat. Off. .
0218344  8/1986  European Pat. Off. .
0122794  7/1983  Japan .................................... 372/45

OTHER PUBLICATIONS

Kaminow et al., "Single-Mode C. W. Ridge-Waveguide Laser Emitting At 1.55 μm", Electronic Letters, Nov. 8, 1975, vol. 15, No. 23, pp. 763-765.
Ackley, D. E. et al., "Twin–Channel Substrate-Mesa-Guide . . . ", Appl. Phys. Lett. 42(8), 15 Apr. 1983, pp. 653-655.
Amann et al., "Low-Threshold InGaAsP-InP . . . ", Japanese Journal of Applied Physics, vol. 25, No. 2, Feb. 1986, pp. 228-230.

Primary Examiner—William L. Sikes
Assistant Examiner—Georgia Y. Epps
Attorney, Agent, or Firm—Birch, Stewart, Kolasch & Birch

[57] ABSTRACT

A semiconductor device is formed by sequentially forming a first clad layer, active layer, second clad layer, and cap layer from, for example, an AlGaAs layer with an AlAs mixing ratio of $\geq 0.4$, on a substrate made of GaAs or the like by MBE, MOCVD or another high precision growth process. Then AlGaAs layer is selectively removed only in the vicinity of formed ridges, and in this part, grooves on two stripes are formed from the cap layer surface, leaving the second clad layer with an intact thickness of, for example, only 3000 Å. An insulation layer made of, for example, SiN is then formed in the groove area and the AlGaAs layer region, thereby creating a current stripe structure, in which only two grooves provide for current passages, that is, the light-emitting regions. In this structure, the thickness of the mesa pattern (ridge part) between the two grooves may be a minimum limit and the processing precision may be improved, while by properly selecting the thickness of the AlGaAs layer, a sufficiently large distance may be set between the mount surface and the active layer, so that the problem of solder climbing-up along the device end surface may be prevented. When the AlAs mixing ratio is controlled at 0.4 in the AlGaAs layer, it is possible to easily remove portions thereof selectively, by using hydrogen fluoride.

15 Claims, 3 Drawing Sheets

SEMICONDUCTOR LASER

BACKGROUND OF THE INVENTION

1. Field of the Invention

This invention relates to a semiconductor laser device possessing a refractive index waveguide mechanism which is capable of operating at high output and at low threshold current.

2. Description of the Prior Art

For a semiconductor laser used in an optical information processing apparatus such as a light signal and an optical disc player, it is indispensable that the laser possess a refractive index waveguide mechanism. Such a semiconductor laser was, conventionally, fabricated by a liquid phase growth process, and various structures were proposed for incorporating said refractive index waveguide mechanism. For example, in the construction using GaAlAs compound as a material, the VSIS (V-channeled substrate inner stripe) laser with the substrate processed in a groove form, CSP (channeled substrate planar) laser, and BH (buried heterostructure) laser having the light-emitting region buried with clad layer are known.

In these laser devices, however, since the liquid phase growth process is used in their manufacture, it is difficult to control the film thickness or composition of each layer that makes up the laser device, and it is also difficult to form very thin active layers in a clean shape free from lattice defects, and it is hence extremely difficult to realize a high performance semiconductor laser low in threshold current density. Besides, the manufacturing yield is poor. To overcome these disadvantages of the liquid phase growth process, and so as to provide a crystal growth method which controls the film thickness very strictly, a molecular beam epitaxial (MBE) process controlling the vacuum deposition technology with extremely high precision, and metalorganic chemical vapor deposition are being introduced recently. Particularly, in the MBE process, it is possible to control the film thickness on the order of the atomic layer, using vacuum analyzers and electronic computers. In this method, however, since the crystal growth mechanism of the semiconductor laser is different from that of the liquid phase growth process, the device structure possessing various refractive index waveguide mechanisms proposed in the liquid phase growth process cannot be applied in production, and other new device structures must be employed. As such new device structures, for example, the ridge waveguide type semiconductor laser shown in FIG. 1 and semiconductor laser device shown in FIG. 2 are proposed.

In the ridge waveguide type laser device in FIG. 1, n-type GaAlAs clad layer 32, GaAs active layer 33, p-type GaAlAs clad layer 34, and p-type GaAs cap layer 37 are sequentially formed on a flat n-type GaAs substrate 31, and all of the sides of cap layer 37 and part of the sides of clad layer 34 are removed by etching. SiO₂ insulation layer 36 is formed on the surface of both the sides of this clad layer 34, and finally a p-side electrode 38 and an n-type electrode 39 are respectively formed on the upper surface and lower surface of the convex form. In the semiconductor laser in FIG. 2, which is manufactured by metalorganic chemical vapor deposition, n-type GaAlAs clad layer 22, GaAs active layer 23, p-type GaAlAs clad layer 24, and n-type GaAs current narrowing layer 25 are sequentially formed on a flat n-type GaAs substrate 21, and the middle part of this current narrowing layer 25 is removed in stripes by etching, and p-type GaAlAs clad layer 26 and p-type GaAs cap layer 27 are formed thereon. Finally, a p-type electrode 28 and an n-type electrode 29 are formed on the upper surface and lower surface of the concave form, respectively.

In the laser device in FIG. 2, since it is taken out of a quartz reaction tube or the like for etching, the surface of the n-type GaAs current narrowing layer 25 is exposed to the atmosphere to be oxidized. In particular, since the surface 20 is close to the light-emitting region 23a of active layer 23, and device deterioration derived from oxygen is likely to occur, and moreover since the current narrowing layer 25 is made of GaAs, light absorption occurs in this area, and it is not desired for reduction of threshold current density. Besides, when GaAlAs is used, for example, as the current narrowing layer 25, crystal growth on the surface is extremely difficult due to oxidation of the GaAlAs surface at the time of etching.

Therefore, in the structure in FIG. 2, it is difficult to sufficiently utilize the low threshold current density characteristics of the MQW (multi quantum well) laser and GRIN-SCH laser making use of the excellent film thickness characteristics and controllability of the composition of the MBE process. On the other hand, the ridge waveguide type semiconductor laser is hard to handle because ridges are exposed on the surface, and it is difficult to mount on the growth layer side where the oscillation region is present. If it is mounted by setting the growth layer up, cooling performance is poor, and it causes problems in the aspects of device reliability and high output operation. Therefore, as the laser device of ridge waveguide type, actually, it seems effective to form a supporting part of the same height as the ridge at both sides of the ridge as shown in FIG. 3. This laser device includes layers from the previously discussed devices, i.e. a substrate 41 on which clad layer 42, active layer 43, clad layer 44, current narrowing layer 45, and insulation layer 46 are formed. Electrodes 47 and 48 are formed on the insulation layer and substrate, respectively. But the following problems are involved with the structure in FIG. 3. That is, in the ridge waveguide type laser device, the device characteristic greatly depends on the ridge shape (ridge width, or thickness from active layer at both sides of ridge to the surface), and to control this ridge shape as accurately as possible, it is desired that the total thickness of the second clad layer 34 and cap layer 37 may be small to an extent that the device characteristics may not be worsened. In this case, however, when mounting the device, the solder such as In goes up along the element end surface to be adhered, and the possibility of short-circuiting the pn junction of device becomes very high.

OBJECTS AND SUMMARY OF THE INVENTION

1. Objects of the Invention

It is hence a primary object of this invention to provide a semiconductor laser device possessing a refractive index waveguide mechanism, free from light absorption, capable of realizing low threshold current operation or high output operation, and capable of being easily fabricated and mounted without any problem.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

2. Summary of the Invention

In order to achieve the above objects, the semiconductor laser device of this invention is manufactured by sequentially forming a first clad layer, active layer, second clad layer, and cap layer, for example, AlGaAs layer with AlAs mixing ratio of >0.4, on a substrate of GaAs or the like developed, for example, by MBE, MOCVD or other high precision growth process, selectively removing the AlGaAs layer only in the vicinity of the ridge forming area, forming in that area grooves above two stripes from the cap layer surface, leaving, for example, the second clad layer by a thickness of 3000 Å, and forming an insulation layer made of SiN or the like in the groove part and AlGaAs layer region, so that only the region provided between the two grooves in the current stripe structure are used for current passage, that is, light-emission region. In this structure, the thickness of the mesa part (ridge part) between the two grooves may be minimum, and the processing precision may be raised, while by properly selecting the thickness of the AlGaAs layer, the distance between the mount surface and active layer may be sufficiently set large enough, and problem of solder climbing-up along the device end surface may not occur. Incidentally, in this AlGaAs layer, when the AlAs mixing ratio is set at $\geq 0.4$, it is possible to remove portions thereof selectively by etching, using, for example, hydrogen fluoride.

The two stripe grooves may possess a refractive index waveguide mechanism by processing the second clad, leaving about 3000 Å as mentioned above. Also, as shown in FIG. 5, by processing so as to cross the active layer in the part slightly remote from the mesa part, it is possible to lower the current, and this is particularly effective for the lowering of the threshold.

Or by designing the AlGaAs layer as the conductive type opposite to that of the cap layer, current of this area is possible by means of the AlGaAs layer, and it is not necessary to form any insulation layer thereon. Instead, by forming a GaAs layer on the AlGaAs layer, the electrode may be formed with the same process as on the mesa (on the cap layer), and problems such as removal of the insulation layer and aggregation of the electrodes do not occur. Moreover, since this process may be done after mesa forming, it is easy to reduce the mesa width, and a lower threshold is expected.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 2 is a structural drawing of a conventional self-aligned semiconductor laser manufactured by the MOCVD process or the like;

DESCRIPTION OF THE PREFERRED EMBODIMENTS

Figure 1:
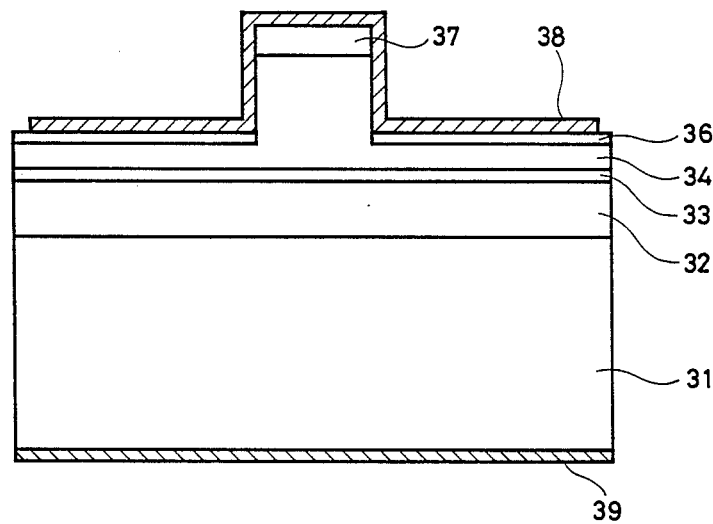
FIG. 1 is a structural drawing of a conventional ridge waveguide type semiconductor laser device.
Figure 2:
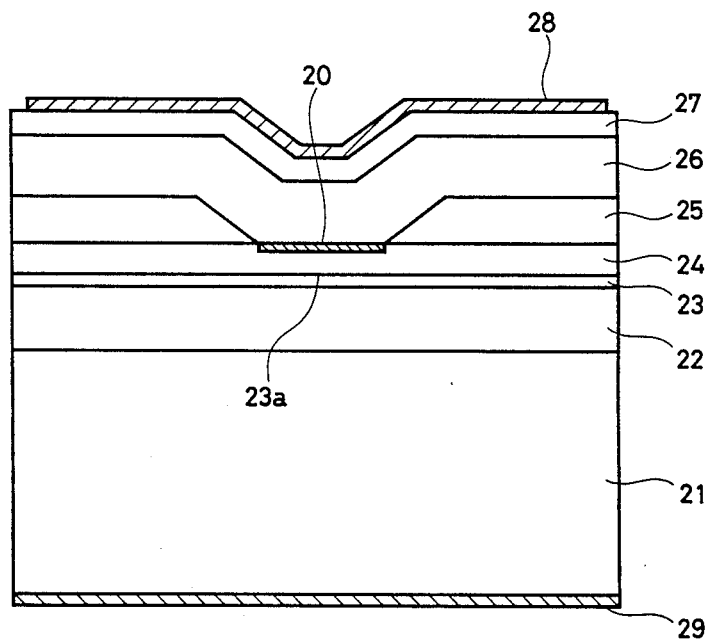
Figure 4:
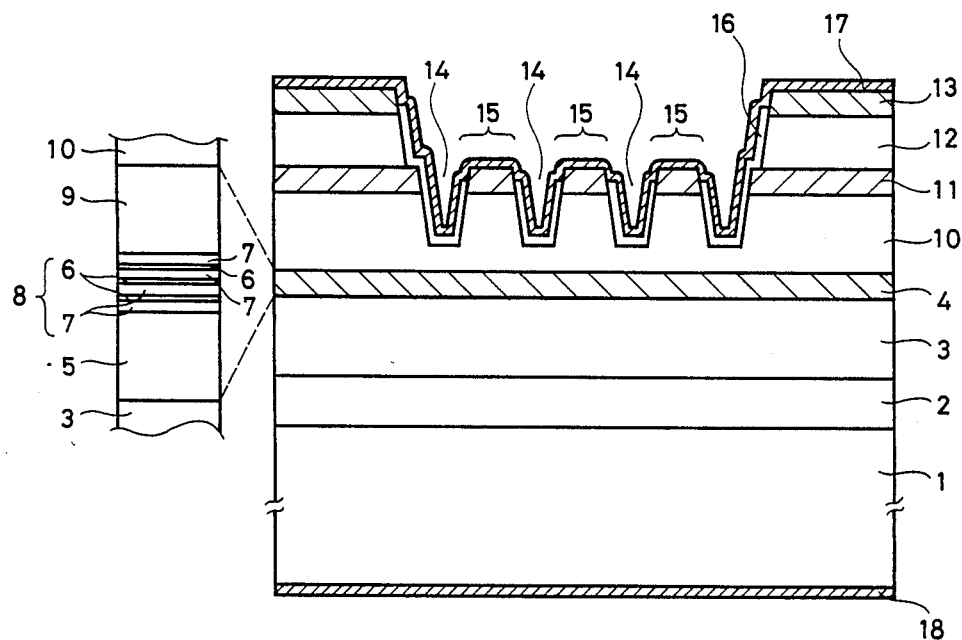
FIG. 4 is a structural drawing of a semiconductor laser device showing one of the embodiments of this invention.
Figure 3:
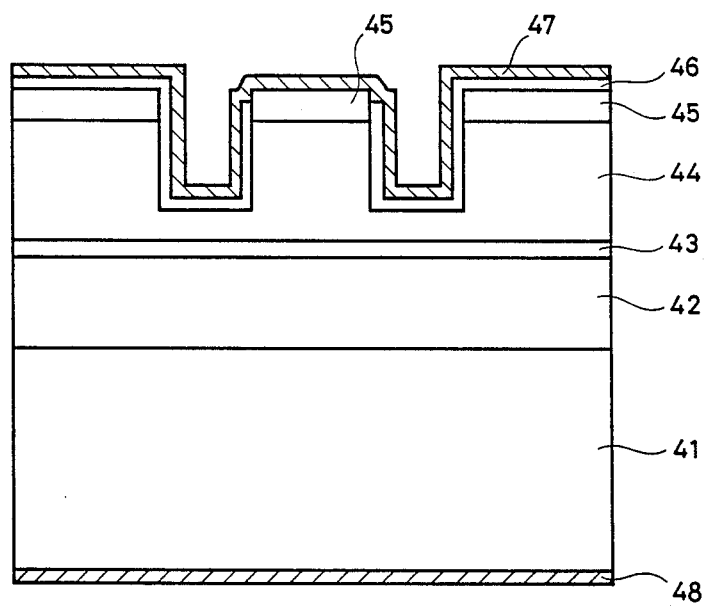
FIG. 3 is a structural drawing of a conventional ridge waveguide type semiconductor laser possessing a supporting part.

FIG. 4 is a sectional view of a GaAs-GaAlAs semiconductor laser showing one of the embodiments of this invention. To form this semiconductor laser, to begin with, n-GaAs buffer layer 2, n-AlGaAs first clad layer 3, and active layer 4 are sequentially deposited on a flat n-GaAs substrate 1 by molecular beam epitaxy (MBE). In this embodiment, particularly, since the active layer 4 is to be the laser oscillation operating part, a multilayer laminate structure of the following layers is used. That is, it is a so-called quantum well structure of a GRIN-SCH structure type consisting of a laminate of an $Al_xGa_{1-x}As$ layer 5 wherein the mixing ratio x varies gradually from 0.7 to 0.28, a superlattice layer 8 alternately laminating three layers of an $Al_{0.28}Ga_{0.72}As$ layer 6 having an extremely thin layer thickness and four layers of a GaAs layer 7 with a similar thin layer thickness, and $Al_yGa_{1-y}As$ layer 9 wherein the mixing ratio y varies gradually from 0.28 to 0.7. On this active layer 4, a P-$Al_{0.7}Ga_{0.3}As$ second clad layer 10, P-GaAs cap layer 11, n-$Al_{0.5}Ga_{0.5}As$ layer 12, and GaAs layer 13 are sequentially deposited.

The resulting structure is taken out of the MBE apparatus, and coated with photoresist, and a stripe window of 30 μm in width is formed by photolithography. With a mixed solution of $NH_4OH$ and $N_2O_2$, and HF, a stripe portion of the GaAs layer 13 and n-$Al_{0.5}Ga_{0.5}As$ layer 12 is selectively removed corresponding to the above window.

Next, the inside portion of the window removed in stripe is coated again with photoresist, and plural stripe-shaped parallel grooves 14 of a narrow width as shown in the drawing are carved by photolithography, and a resist pattern for forming a mesa pattern 15 between second clad layer 10 and cap layer 11 is formed between grooves 14. The grooves 14 are formed with such a depth that the second clad layer 10 has a thickness without grooves left over of about 2000 Å using the reactive ion beam etching process. After forming grooves 14, the resist is removed, and the entire surface is coated with a SiN film 16 by the plasma CVD process. Again by photolithography, the groove part 14 is removed, and SiN film 16 is taken away to pass the current passage. Furthermore, after polishing the wafer to a proper thickness, P-side electrodes 17 are formed on the exposed surfaces of GaAs layer 13, cap layer 11, and SiN film 16, while n-side electrode 18 is formed on the back side of the GaAs substrate, so that individual laser chips are formed by division using the cleavage process.

This embodiment is an array structure possessing three mesa patterns 15 (ridges), but the number of mesa patterns is not limited to this. Besides, the active layer 4 is not limited to the GRIN-SCH structure, and various double heterojunction structures can be applied.

When a driving current is injected through the p-type electrode 17 and n-type electrode 18, the current flows into the active layer 4 from right above the removed mesa pattern 15 of the SiN film 16, and reaches up to the n-type electrode 18. When the current flows into the active layer 4, laser oscillation is started in this part. This SiN film 16 is an insulator, and the n-AlGaAs layer 12 is biased in reverse polarity, and current does not flow in this part.

Figure 5:
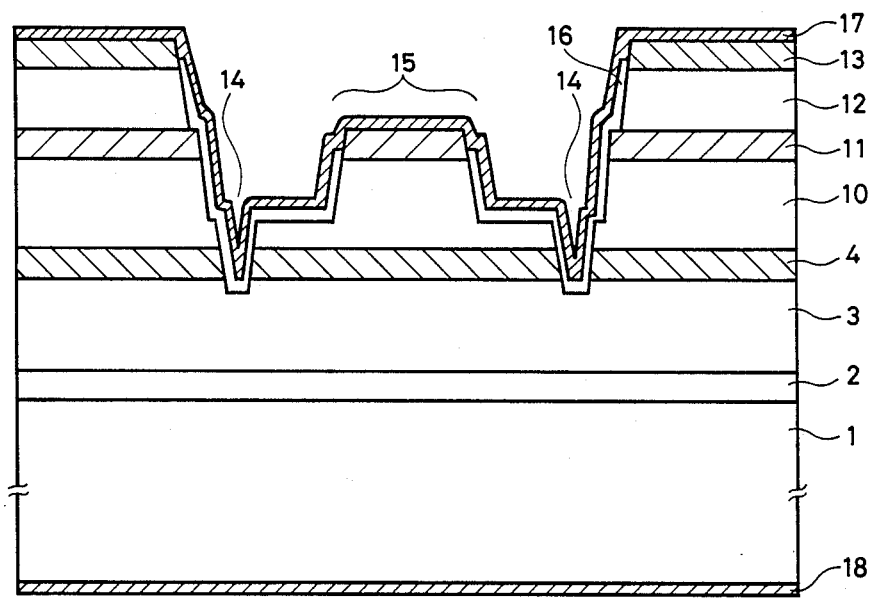
FIG. 5 is a structural drawing of a semiconductor laser device showing another embodiment of this invention.

FIG. 5 is a structural drawing of a semiconductor laser device showing other embodiment of this invention.

In this embodiment, the stripe parallel grooves 14 formed within the stripe-shaped window are carved by two pieces at both sides, and the depth of the parallel grooves 14 is enough to penetrate through the active layer 4. The other constitution is the same as in the embodiment shown in FIG. 4, and the current passage is formed in the direction of active layer 4 from right above the mesa pattern 15 formed between two parallel grooves 14. Since the active layer 4 is separated by the parallel grooves 14, the current flowing in this part does not spread outward, the generation of reactive current not contributing to the oscillation of the laser may be prevented. A flat part is present between the foot area of the meas pattern 15 and the parallel grooves 14, and with this flat part, the laser device of this embodiment becomes a refractive index waveguide type semiconductor laser.

As is clear from the explanation above, this invention provides a semiconductor laser possessing an excellent heat releasing property, high processing precision, advantageous mounting characteristics and assured high performance. In particular, a high performance, refractive index waveguide type semiconductor laser can be obtained by using semiconductor crystal layers having film thickness and composition controlled at a high degree and being developed by molecular beam epitaxy (MBE) or metalorganic chemical vapor deposition (MDCVD) processes.

This invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor laser device which includes a crystal multilayer structure containing an active layer which includes a laser oscillation region laminated on a substrate, wherein a window groove is formed in said structure above said active layer and at least two parallel stripe grooves are formed in the bottom portion of said window groove so as to form at least a mesa region therebetween, and wherein current passage in said laser oscillation region is limited by said mesa region.

2. The semiconductor laser of claim 1, wherein said crystal multilayer structure includes a first clad layer formed between said active layer and said substrate, a second clad layer formed on said active layer, and a cap layer formed on said second clad layer.

3. A semiconductor laser comprising:
a GaAs substrate;
an n-GaAs buffer layer formed on said substrate;
an n-AlGaAs first clad layer formed on said buffer layer;
an active layer formed on said first clad layer;
a p-AlGaAs second clad layer formed on said active layer;
a p-GaAs cap layer formed on said second clad layer;
an n-AlGaAs first upper layer formed on said cap layer;
a GaAs second upper layer formed on said first upper layer;
wherein a stripe window is formed in said first and second upper layers; and
wherein at least a stripe groove is formed in said stripe window and in said second clad layer through said cap layer.

4. The semiconductor laser of claim 3, wherein said second clad layer has a thickness of about 2000 Å between said stripe groove and said active layer.

5. The semiconductor laser of claim 2, wherein said crystal multilayer structure includes a buffer layer formed between said first clad layer and said substrate, a first upper layer formed on said cap layer, a second upper layer formed on said first upper layer, and first and second electrodes formed on said substrate and said second upper layer, respectively.

6. The semiconductor laser of claim 5, wherein said window groove is formed at a depth so as to reach said cap layer, and wherein an insulation layer is formed in said window groove and said stripe grooves but not on the upper portion of said mesa region.

7. The semiconductor laser of claim 6, wherein said stripe grooves are formed so as to reach said active layer.

8. The semiconductor laser of claim 7, wherein said crystal multilayer structure includes two stripe grooves and one mesa region.

9. The semiconductor laser of claim 8, wherein said active layer comprises a laminate of:
an $Al_xGa_{1-x}As$ lower layer, wherein the mixing ratio x varies gradually from 0.7 to 0.28;
a superlattice layer formed on said lower layer comprising three layers of AlGaAs each having an extremely thin layer thickness laminated alternatively on four layers of GaAs each having an extremely thin layer thickness; and
an $Al_yGa_{1-y}As$ upper layer, wherein the mixing ratio y varies gradually from 0.28 to 0.7.

10. The semiconductor laser of claim 9, wherein said substrate comprises GaAs, said buffer layer comprises GaAs, said first and second clad layers comprise AlGaAs, said cap layer comprises GaAs, said first upper layer comprises AlGaAs, and said second upper layer comprises GaAs.

11. The semiconductor laser of claim 6, wherein said stripe grooves are formed so as to reach into said second clad layer.

12. The semiconductor laser of claim 11, wherein said active layer comprises a laminate of:
an $Al_xGa_{1-x}As$ lower layer, wherein the mixing ratio x varies gradually from 0.7 to 0.28;
a superlattice layer formed on said lower layer comprising three layers of AlGaAs each having an extremely thin layer thickness laminated alternatively on four layers of GaAs each having an extremely thin layer thickness; and
an $Al_yGa_{1-y}As$ upper layer, wherein the mixing ratio y varies gradually from 0.28 to 0.7.

13. The semiconductor laser of claim 12, wherein more than two stripe grooves and more than one mesa region are formed.

14. The semiconductor laser of claim 12, wherein four stripe grooves and three mesa regions are formed.

15. The semiconductor laser of claim 13, wherein said substrate comprises GaAs, said buffer layer comprises GaAs, said first and second clad layers comprise AlGaAs, said cap layer comprises GaAs, said first upper layer comprises AlGaAs, and said second upper layer comprises GaAs.

* * * * *